United States Patent [19]

Frass et al.

[11] Patent Number: 5,705,313
[45] Date of Patent: Jan. 6, 1998

[54] PROCESS FOR THE PRODUCTION OF A LITHOGRAPHIC PRINTING PLATE THROUGH SELECTIVE TRANSFER

[75] Inventors: Werner Frass, Wiesbaden, Germany; Stephan J. W. Platzer, Califon, N.J.; Willi-Kurt Gries, Wiesbaden, Germany

[73] Assignee: AGFA-Gevaert AG, Leverkusen, Germany

[21] Appl. No.: 532,954

[22] Filed: Sep. 22, 1995

[30] Foreign Application Priority Data

Sep. 26, 1994 [DE] Germany .................... 44 34 278.0

[51] Int. Cl.⁶ .................................................. G03F 7/34
[52] U.S. Cl. ................................... 430/253; 430/302
[58] Field of Search ............................. 430/253, 254, 430/302

[56] References Cited

U.S. PATENT DOCUMENTS

| | | |
|---|---|---|
| 3,469,983 | 9/1969 | Diener et al. . |
| 4,175,964 | 11/1979 | Uchida et al. . |

FOREIGN PATENT DOCUMENTS

| | | |
|---|---|---|
| 0 530 674 A1 | 3/1993 | European Pat. Off. . |
| 0 568 841 A1 | 11/1993 | European Pat. Off. . |
| 650094 | 4/1995 | European Pat. Off. . |
| 2631072 | 2/1977 | Germany . |
| 43 36 115 | 5/1994 | Germany . |
| 44 15 607 | 10/1994 | Germany . |
| 1090663 | 11/1967 | United Kingdom . |
| 1530410 | 11/1978 | United Kingdom . |
| WO 93/05446 | 3/1993 | WIPO . |

*Primary Examiner*—Christopher G. Young
*Attorney, Agent, or Firm*—Foley & Lardner

[57] ABSTRACT

A process for the production of a lithographic printing plate is described, in which a photosensitive material comprising a substrate suitable for lithographic printing, a hydrophilic intermediate layer, a photopolymerizable layer which changes its adhesion to the hydrophilic layer and/or to the cover sheet on exposure to light and a transparent cover sheet provided with an exposure mask which is non-transparent to actinic light is exposed to actinic light through the exposure mask, and the photopolymerizable layer is developed to give the image by peeling off the cover sheet from the substrate.

The process is carried out in all stages without the use of chemicals and gives printing plates having good oleophilic properties and a long press life.

17 Claims, No Drawings

PROCESS FOR THE PRODUCTION OF A LITHOGRAPHIC PRINTING PLATE THROUGH SELECTIVE TRANSFER

The present invention relates to a process for the production of lithographic printing plates, in which a photosensitive material comprising a substrate suitable for lithographic printing, a photopolymerizable layer and a transparent cover sheet provided with an exposure mask non-transparent to actinic light is exposed to actinic light through the exposure mask and the photopolymerizable layer is developed to give the image.

A process of the stated generic type is disclosed in EP-A 568 841. In that process, an exposure mask is applied to the surface of a photosensitive layer or of a cover sheet present thereon by the inkjet method, and the photopolymerizable layer is exposed through the exposure mask. Development is effected by washing out the unexposed parts of the layer or treating said parts with toner; heating, ammonia treatment, peel-apart development, diffusion transfer, ink coupling and the like are mentioned as further possibilities, without further details being given.

EP-A 530 674 describes a photosensitive material which carries an intermediate layer comprising a hydrophilic polymer (e.g. polyvinyl alcohol, and a polymerizable compound between the substrate and the photopolymerizable layer. When exposed under an original, the polymerizable compound participates in the polymerization of the photopolymerizable layer and ensures increased adhesion between these layers. Development is effected by means of mechanical separation of substrate and cover sheet, the exposed parts of the layer remaining on the substrate. The printing plates obtained using this material do not give satisfactory printed copies.

WO-A 93/5446 describes a material which is similar to that described above and is processed in the same manner but contains a hydrophilic photopolymerizable intermediate layer having a relatively high content of monomers and of photoinitiators. Here, the intermediate layer is susceptible to undesired partial polymerization if it is handled in daylight during processing after imagewise exposure. In the absence of special precautions, polymerization and hence oleophilization of the nonimage parts can easily occur, leading to greasing during lithographic printing.

The nonprior published German Patent Application P 43 36 115.3 describes a photosensitive material for the production of lithographic printing plates which carries, on a substrate, a hydrophilic layer comprising a crosslinkable or a crosslinked organic polymer, a photopolymerizable layer and a transparent cover sheet. The material is exposed in contact under an original or by means of controlled laser radiation and is developed by peeling apart cover sheet and substrate.

The nonprior published German Patent Application P 44 15 607.3 describes an otherwise identical photosensitive material whose hydrophilic layer contains an organic polymer and a compound capable of free radical polymerization and has a layer weight of from 0.001 to 1 g/m². Processing is carried out in the same manner as for the material described above.

It was the object of the invention to propose a process for the production of lithographic printing plates, in which a photosensitive material is subjected to imagewise exposure without the use of a contact printing original and can be developed without the use of solutions or chemicals to give a printing plate having a long press life without any tendency to greasing.

The invention starts from a process of the generic type described at the outset.

The process according to the invention comprises using material which has a hydrophilic intermediate layer between the photopolymerizable layer and the substrate and whose photopolymerizable layer changes its adhesion to the hydrophilic layer and/or to the cover sheet on exposure to light, and developing the exposed material by peeling off the cover sheet from the substrate.

The invention furthermore proposes a photosensitive material for the production of lithographic printing plates which carries a photopolymerizable layer and a transparent cover sheet on a substrate suitable for lithographic printing.

In the material according to the invention, the hydrophilic intermediate layer is arranged between the photopolymerizable layer and the substrate, the photopolymerizable layer is such that it changes its adhesion to the hydrophilic layer and/or to the cover sheet on exposure to light and the cover sheet carries an exposure mask non-transparent to actinic light.

The hydrophilic intermediate layer is required for a well defined differentiation between oleophilic image parts and hydrophilic nonimage parts of the printing plate. In particular, it prevents residues of the oleophilic photopolymerizable layer from remaining in the indentations in the rough substrate surface during the peel-apart development and resulting in greasing there, i.e. accepting printing ink. The intermediate layer is generally formed from a hydrophilic, usually water-soluble organic polymer which is expediently rendered insoluble by crosslinking or by polymerization of a polymerizable compound contained therein. The insolubility should in any case be produced at the time of printing, in order to avoid underwashing of the image elements by the fountain solution.

Suitable intermediate layers are obtained, for example, by curing water-soluble layers which contain a water-soluble polymer and a curing agent. The curing agent may be a compound which reacts with the polymer with crosslinking, or a polyunsaturated polymerizable compound which polymerizes to give a highly polymeric crosslinked product which encloses the water-soluble polymer and renders it insoluble. The polymer/crosslinking combinations can preferably be thermally crosslinked; the polymerization can be initiated in particular by free radicals with exposure to radiation.

Hydrophilic polymers suitable for producing the hydrophilic layer are described by C. L. McCormick, J. Bock and D. N. Schulz in Encyclopedia of Polymer Science and Engineering 17, 730 (1985). Depending on the functional groups contained in the polymers, the crosslinking may be achieved only with these polymers, for example by heating. It is frequently advantageous to use low molecular weight or high molecular weight organic or inorganic crosslinking agents. Crosslinking catalysts may also be added for accelerating the reaction.

Examples of suitable water-crosslinkable polymers are nucleotides, polypeptides, polysaccharides, polyacrylamides, polyethylene oxides, polyvinyl alcohols, their copolymers or graft copolymers and the water-soluble derivatives of such polymers, which derivatives are obtained by polymer-analogous reaction. Ionizable polymers, such as polyamines, polyimines, polyvinylpyridines, polyvinylpyrrolidones, poly(meth)acrylic acids, polysulfonic acids and polyphosphonic acids, may also be used. Furthermore, the amphoteric acrylate copolymers described in DE-A 40 23 269 and 40 23 268 may advantageously be used. Preferred polymers are those having vinyl alcohol, vinylpyrrolidone and (meth)acrylic acid units.

Suitable crosslinking agents are water-soluble polyvalent compounds which react with the polymer only at elevated temperature, for example polyhydric alcohols, such as glycols or oligoglycols, glycerol, trimethylolethane or trimethylolpropane or pentaerythritol, polyfunctional aldehydes, such as glyoxal or glutaraldehyde; polybasic acids, such as oxalic acid or citric acid; oxo acid derivatives of boron, of aluminum, of silicon, of phosphorus or of chromium; or polyfunctional amines, such as ethylenediamine, oligoethyleneoligoamines or polyethyleneimines.

Suitable crosslinking catalysts are mainly acids or bases, e.g. p-toluenesulfonic acid, sulfuric acid, sodium hydroxide, tertiary amines or quaternary ammonium bases.

Instead of the crosslinking agent, the layer may also contain a small amount of a compound capable of free radical polymerization. This compound contains one polymerizable ethylenic double bond or, preferably, two or more polymerizable ethylenic double bonds. Hydrophilic esters or amides of (meth)acrylic, maleic, fumaric or vinylphosphonic acid are particularly suitable. In particular, esters of acrylic or methacrylic acid with polyhydric aliphatic alcohols, e.g. glycols, oligoglycols, glycerol, diglycerol, trimethylolethane, trimethylolpropane, pentaerythritol or dipentaerythritol, which are preferably only partly esterified and, if required, extended by reaction with ethylene glycol or propylene glycol, may advantageously be used. Amides of the stated unsaturated acids are also suitable.

The amount of polymers is preferably between 50 and 95% by weight and that of polymerizable compound between 5 and 50% by weight. The crosslinking agent is in general present in an amount of from 1 to 30% by weight.

The layer weight of the hydrophilic layer (b) is preferably from 0.01 to 1, particularly preferably from 0.05 to 0.5, g/m$^2$.

Suitable layers are described, inter alia, in the prior German Patent Applications No. P 43 36 115.3 and No. P 44 15 607.3.

The exposure mask is produced on the transparent cover sheet preferably by digital imaging, for example by means of a computer-controlled laser printer or by producing in another manner a color or toner image which absorbs in the actinic range. Apparatuses suitable for this purpose are non-impact printers which permit non-contact color or toner transfer. Suitable printing processes are described, for example, by W. E. Haas in "Imaging Processes and Materials" (Editors: J. Sturge, V. Walwarth and A. Shepp), page 375 et seq., Nostrand Reinhold, N.Y. 1989. The electrophotographic output units summarized under the overall term laser printer, and inkjet, thermal transfer and thermal sublimation systems, are suitable. The standards recommended for the particular type of apparatus are used as toner, ink and printer ribbon materials for producing black/white images on paper or film. The surface of the cover sheet may be pretreated to improve the adhesion. Particularly in the case of printing by means of the inkjet process, it is expedient to apply an additional layer for regulating the rate of evaporation of volatile components of the printing ink. The production of the exposure mask by direct toner application is described, for example, in U.S. Pat. No. 4,429,027. The exposure mask is in principle applied to the outer (free) surface of the cover sheet.

The photopolymerizable layer is present underneath the transparent cover sheet. This photopolymerizable layer contains, in a manner known per se, as essential components, (1) a polymeric binder,
(2) a compound capable of free radical polymerization and
(3) a compound or a combination of compounds which is capable of initiating the polymerization of the compound (2) under the action of actinic radiation.

The binder (1) must be compatible with the other components, i.e. no phase separation may occur within the layer over the entire temperature range of production and use. Furthermore, depending on the form (positive or negative type), it is necessary for either the unexposed or the exposed layer parts to have greater adhesion to the cover sheet than to the substrate. Conversely, the exposed or unexposed parts should adhere more strongly to the substrate than to the cover sheet. Examples of suitable polymers are chlorinated polyolefins, e.g. chlorinated polyethylenes and chlorinated polypropylenes; poly(meth)acrylates, polyacrylonitrile, polystyrene, polyvinyl chloride, polyvinylidene chloride, polybutadiene, polyisoprene, polychloroprene, chlorinated natural rubbers, polyvinyl acetate, polyvinyl acetals, polyesters, polyamides and polyurethanes and the copolymers of the monomers on which these polymers are based. Chlorinated natural rubbers, poly (meth)acrylates and their copolymers and polyamides are preferably used. Members of the class comprising the polyvinylacetals, in particular the polyvinylbutyrals, are also preferably used. The amount of binder in the photopolymer layer is between 10 and 90%, but preferably between 70 and 20%, based in each case on the weight of the nonvolatile components, i.e. of the components of the layer which remain behind on evaporation of the solvent at temperatures up to about 120° C.

The compound (2) capable of free radical polymerization is an ethylenically unsaturated substance or a corresponding mixture of substances in the form of esters or amides of acrylic, methacrylic, fumaric or maleic acid.

Members having more than one polymerizable double bond, for example the esters of the stated acids with alkanediols, (poly/oligo)ethylene glycols, (poly/oligo) propylene glycols, (poly/oligo)butylene glycols and other low molecular weight or relatively high molecular weight organic diols, are preferred. The esters of polyhydric alcohols, such as glycerol, trimethylolethane or trimethylolpropane, pentaerythritol, isocyanic acid, their ethoxylated or propoxylated derivatives and the dimers or oligomers of these compounds are particularly suitable. As high a degree of esterification as possible is advantageous. Amides, for example the compounds which are formally formed in the reaction of ethylenediamine or its oligomers with the acids described, may also be used. The amount of the monomers is about 5 to 80, preferably about 10 to 60%, by weight of the nonvolatile components.

Depending on the desired sensitization range, various materials are used as photoinitiators (3). If the photosensitive material is to be sensitive to the near UV range (350–420 nm) usual in offset printing, the photoinitiator systems used differ from those used when exposure is to be effected in the visible spectral range.

Examples are acyloins and their derivatives, such as benzoin, benzoin alkyl ethers, vicinal diketones and their derivatives, e.g. benzil, benzil acetals, such as benzil dimethyl ketal, fluorenones, thioxanthones, polynuclear quinones, acridines and quinoxalines, and trichloromethyl-s-triazines, 2-halomethyl-4-vinyl-1,3,4-oxadiazole derivatives, halooxazoles substituted by trichloromethyl groups, carbonylmethyleneheterocycles containing trihalomethyl groups and acylphosphine oxide compounds. The photoinitiators can also be used in combination with one another or with coinitiators or activators, for example with Michler's ketone and its derivatives or 2-alkylanthraquinones. In the case of the photoinitiators used in the visible range, mixtures of metallocenes, photoreducible dyes, photolytically cleavable compounds having trihalomethyl groups and, if required, further initiator and dye components, as described, for example, in EP-A 364 735, are generally suitable. The metallocene component comprises variously substituted cyclopentadienyl complexes of titanium or of zirconium. Xanthene, benzoxanthene, benzothioxanthene, thiazine, pyronine, porphyrin or acridine dyes can be used as photoreducible dyes. In the case of the trihalomethyl coinitiators, the known triazine derivatives with bromine or chlorine as halogen have proven particularly useful. Further initiator components are compounds which increase the sensitivity, particularly in the near UV range, for example acridine, phenazine or quinoxaline derivatives, or which result in an increase in the sensitivity in the visible range, for example dibenzylacetones or coumarins.

The amount of the photoinitiator or of the initiator combination is in general about 0.1 to 15% by weight, preferably about 0.5 to 10% by weight, of the nonvolatile layer components.

The photopolymerizable layer can moreover contain stabilizers for suppressing thermal polymerization, pigments, dyes, plasticizers or other assistants for improving mechanical or reprographic quality.

The layer thickness of the photopolymerizable layer, expressed by the layer weight, is from 0.1 to 10 g/m$^2$, preferably from 0.5 to 5.0 g/m$^2$.

In particular, suitable flexible transparent cover sheets for the photosensitive materials are those plastics films which are dimensionally stable on heating to about 60° to 130° C. For example, films of cellulose acetate, polystyrene, polyamides, polycarbonates, polyesters and polyimides are suitable for this purpose. The films should preferably have little permeability to atmospheric oxygen. Films of polyesters, polycarbonates, polyimides and similar polymers are therefore preferably used; polyester films are generally preferred. The cover sheet may have a thickness in the range from about 20 to 100, preferably 30 to 70, µm. In order to improve the dimensional stability, the films are generally biaxially stretched and, if required, heat-set. In order to improve the adhesion of the photopolymerizable layer, the surface may be subjected to a treatment which increases the adhesion, for example by corona discharge, by etching with chemicals, i.e. trichloroacetic acid, and by coating with an adhesion-promoting lower layer. Such coatings are generally from 0.001 to 0.1 µm thick. They may comprise copolymers of (meth)acrylates, as described, for example, in U.S. Pat. No. 4,098,952, and may preferably be crosslinked. Suitable films are described in U.S. Pat. No. 5,049,476. The outer surface of the film may be subjected to a treatment which prevents blocking, for example by coating with a suitable lower layer which contains finely divided organic or, in particular, inorganic particles, the size, amount and refractive index of which are such that the transparency of the film is not adversely affected. The surface may be smooth or matt. Corresponding films are described, for example, in EP-A 130 222.

The substrate is a metallic sheet usually used as a substrate for lithographic printing plates and having a hydrophilic surface. A preferred metal is aluminum, which in particular is superficially roughened and anodically oxidized. The surface may furthermore have been treated in a known manner with alkali metal silicates, phosphates, hexafluorozirconates, polyvinylphosphonic acid or other conventional pretreatment agents. The thickness of the substrate is in general between 0.05 and 1, preferably between 0.1 and 0.5, mm.

The photosensitive material is prepared by dissolving the components of the hydrophilic intermediate layer in a suitable solvent, in general water or a mixture of water with water-miscible organic solvents, such as lower alkanols, acetone or the like, and applying the solution to the surface of the substrate in such a way that the desired layer thickness is obtained after drying. The photopolymerizable layer is then applied to the dried intermediate layer, as a rule likewise by coating from a solution. The solvent is chosen so that the hydrophilic intermediate layer is not superficially dissolved. The cover sheet provided with the exposure mask is then applied to the photopolymerizable layer by lamination. Lamination may be effected at room temperature or at elevated temperature.

The photosensitive material obtained is exposed through the transparent cover sheet with the exposure mask. As a result of the imagewise crosslinking of the photopolymerizable layer, its adhesion to the cover sheet and/or to the hydrophilic intermediate layer is changed in such a way that, when the cover sheet is peeled off, either the exposed or the unexposed parts of the layer are removed therewith. A positive image remains on the substrate in the first case and a negative image in the second case. The adhesion behavior, which gives either a positive or a negative image, can be controlled by means known in principle. Since in general the adhesion of the photopolymerizable layer to the rough surface of the substrate, which is not leveled out by the relatively thin hydrophilic layer, is greater than to the transparent cover sheets, this film should as a rule be subjected to an adhesion-promoting surface treatment, as described above. In most cases, the photopolymerization results in an increase in the adhesion of the photopolymerizable layer to the rough substrate surface covered by the hydrophilic intermediate layer. A change in this behavior can be achieved both by changing the composition, in particular the type of binder and of polymerizable compound, of the photopolymerizable layer and of the hydrophilic layer. Thus, in many cases with hydrophilic layers whose hydrophilicity is due to the presence of OH groups, the adhesion at the interface with the photopolymerizable layer is changed by exposure in such a way that a negative image is obtained. In other cases where the hydrophilic layer contains, for example, carboxyl groups or other acid groups, positive images are frequently obtained. In general, the nature of the photopolymerizable layer has a relatively great influence on the copying result. Thus, predominantly negative copies are obtained with layers which contain conventional free radical initiators and binders based on (meth)acrylate polymers, whereas, as a rule, positive copies are obtained with layers which contain polyvinylacetals as binders and those initiators which form acids on exposure. Possibilities for influencing the adhesion behavior are known and are described, inter alia, in the article "Photosensitive Materials by Peel-off Development" by T. Ikeda, T. Yamaoka and T. Tsunoda in Graphic Arts Japan, Vol. 21 (1979–1980), pages 26–31.

After image development to the negative, the image remaining on the substrate and comprising cured parts of the layer can be thermally postcured or baked in a manner known per se in order to increase the press life during printing. In the production of positive printing plates, in which the unpolymerized parts of the layer remain behind on the substrate, it is as a rule necessary to cure the printing template by heating and/or post-exposure. The finished printing plate can advantageously be preserved in the conventional manner by coating with an aqueous solution of a polymer.

As a result of the process according to the invention, lithographic printing plates are obtained by a processing method for which no liquid developers or other processing solutions are required. Since in addition the original produced in situ requires no processing with chemicals, in the process according to the invention the entire process of printing plate production is possible without the use of chemicals or processing solutions.

The following Examples describe preferred embodiments of the invention. The amounts of the components are generally expressed in parts by weight (pbw). Ratios and percentages are to be understood as weight units, unless stated otherwise.

EXAMPLE 1

A 0.3 mm thick aluminum sheet which had been electrolytically roughened and anodically oxidized to an oxide layer weight of 3.6 g/m$^2$ was coated with a solution of the following composition:

9.0 pbw of a 40% strength aqueous solution of an acrylate resin (Röhm GmbH, Acrytex W 240), 4.8 pbw of trimethylolpropane, 0.24 pbw of p-toluenesulfonic acid and 576 pbw of a 0.1% strength aqueous solution of the disodium salt of an n-decyl-2,2'-disulfodiphenyl ether and dried to give a layer of 0.3 g/m$^2$. The aluminum sheet precoated in this manner was then coated with a solution of the following composition:

7.0 pbw of an alkyl methacrylate copolymer (Tg 80° C., acid number 5), 56.0 pbw of polyvinylbutyral (80% of vinylbutyral units, 18% of vinyl alcohol units, 2% of vinyl acetate units, Tg 72°–78° C.), 36.0 pbw of pentaerythrityl tetraacrylate, 54.0 pbw of dipentaerythrityl pentaacrylate, 3.6 pbw of 2,6-bistrichloromethyl-4-(4-styrylphenyl)-s-triazine, 10.8 pbw of terephthalaldehyde, 11.7 pbw of Renol blue B 2 G (C.I. 74160) and 0.9 pbw of 2,6-di-tert-butyl-4-methylphenol in 1001 pbw of tetrahydrofuran, 682 pbw of propylene glycol monomethyl ether and 137 pbw of butyrolactone.

The layer weight obtained after drying was 2.3 g/m$^2$.

A 50 μm thick polyethylene terephthalate film provided with an adhesion promoter on one side and with an antiblocking treatment on the other side was printed with various black test elements by means of an HP ®Laserjet III laser printer on the side with the antiblocking treatment. The adhesion-promoting side of the image-bearing film was laminated under pressure at 90° C. with the photopolymerizable layer described above and exposed through the film to a 5 kW metal halide lamp at a distance of 110 cm for 14 seconds in an exposure frame for lithographic printing plates. Thereafter, the cover sheet was peeled off manually at an angle of 180° C., the exposed parts of the photopolymerizable layer being removed cleanly together with the cover sheet whereas the hydrophilic intermediate layer and the unexposed parts remained behind on the aluminum sheet. These parts were completely cured by 50-second uniform exposure and 15-minute postbaking of the printing plate at 200° C. Before the postbake, an aqueous solution of the disulfodiphenyl ether used in the hydrophilic layer was applied to the entire surface of the printing plate as a baking gum in order to prevent the postbake from having an adverse effect on the hydrophilicity of the nonimage parts.

EXAMPLE 2

The roughened and anodized aluminum sheet stated in Example 1 was coated with an aqueous solution of 0.8% of a partly hydrolyzed polyethylene glycol/vinyl acetate graft polymer having an ester number of 150 and 0.2% of boric acid.

The layer weight was 0.1 g/m$^2$ after drying for 1 minute at 100° C. The following solution was applied to the precoated aluminum sheet.

93.1 pbw of polyethyl methacrylate (Tg 65° C., acid number 8), 1.8 pbw of polymethyl methacrylate (Tg 105° C., acid number<1), 68.4 pbw of trimethylolpropane triacrylate, 2.7 pbw of 2-benzyl-2-dimethylamino-1-(4-morpholinophenyl)-butan-1-one, 3.24 pbw of 4-diethylamino-4'-methoxydibenzalacetone, 9.0 pbw of Renol blue B 2 G, 0.9 pbw of 2,6-di-tert-butyl-4-methylphenol and 1.44 pbw of silicone oil in 913 pbw of butanone, 88.2 pbw of tetrahydrofuran, 683 pbw of propylene glycol monomethyl ether and 137 pbw of butyrolactone.

After drying, the layer weight was 2.3 g/m$^2$.

As in Example 1, an exposure mask, in this case a negative mask, was produced by means of a laser printer. The back of the image-bearing film was laminated with the photopolymerizable layer of the printing plate under pressure at 90° C. After exposure for 10 seconds without an original, the cover sheet was peeled off together with the unexposed parts of the photosensitive layer. The photocured parts of the photopolymerizable layer which remained on the aluminum sheet were used for printing without further treatment.

We claim:

1. A process for the production of a lithographic printing plate comprising
   (a) providing a photosensitive material comprising in the following order:
      (i) a substrate suitable for lithographic printing,
      (ii) a hydrophilic intermediate layer,
      (iii) a photopolymerizable layer which changes its adhesion to the hydrophilic layer or to the cover sheet upon exposure to light,
      (iv) a transparent cover sheet, and
      (v) an exposure mask non-transparent to actinic light which adheres to the transparent cover sheet,
   (b) exposing said material to actinic light through the exposure mask, and
   (c) developing the photopolymerizable layer by peeling off the cover sheet carrying the exposure mask from the substrate, thereby removing either the exposed or the unexposed parts of the photopolymerizable layer, to give an image.

2. A process as claimed in claim 1, wherein the photopolymerizable layer adheres more strongly to the hydrophilic layer than to the cover sheet before exposure to light and more strongly to the cover sheet than to the hydrophilic layer after exposure to light, wherein the exposure mask comprises a positive exposure mask, and wherein uncured image parts of the photopolymerizable layer which remain on the substrate after development are cured by exposure to light or heating.

3. A process as claimed in claim 1, wherein the photopolymerizable layer adheres more strongly to the cover sheet than to the hydrophilic layer before exposure to light and more strongly to the hydrophilic layer than to the cover sheet after exposure to light, and wherein the exposure masks comprises a negative exposure mask.

4. A process as claimed in claim 1, wherein the hydrophilic intermediate layer is cured or is curable by crosslinking or polymerization.

5. A process as claimed in claim 4, wherein the hydrophilic intermediate layer comprises a crosslinkable organic polymer or is a layer formed by crosslinking such a polymer.

6. A process as claimed in claim 4, wherein the hydrophilic intermediate layer comprises an organic polymer and a compound capable of free radical polymerization.

7. A process as claimed in claim 1, wherein the hydrophilic intermediate layer has a layer weight of from 0.001 to 1 g/m$^2$.

8. A process as claimed in claim 1, wherein the exposure mask is applied to the cover sheet by means of an electronically controlled printing process.

9. A process as claimed in claim 1, wherein the exposure mask is formed on the cover sheet and the cover sheet is then laminated with the photopolymerizable layer.

10. A process as claimed in claim 9, wherein the back of the image-bearing cover sheet is laminated with the photopolymerizable layer.

11. A process as claimed in claim 1, wherein the photopolymerizable layer comprises:

1) a polymeric binder, 2) a compound capable of free radical polymerization, and 3) a compound or a combination of compounds which is capable of initiating the polymerization of the compound (2) under the action of actinic light.

12. A process as claimed in claim 1, wherein the development is performed without the use of liquid developers.

13. A process as claimed in claim 1, wherein the exposing occurs without the use of a contact printing original.

14. A process as claimed in claim 1, wherein the hydrophilic intermediate layer is formed from a hydrophilic, water-soluble, organic polymer, rendered insoluble by crosslinking or polymerization.

15. A process as claimed in claim 1, wherein the exposure mask is formed by digital imaging.

16. A process as claimed in claim 1, wherein the exposure mask comprises a toner image.

17. A process as claimed in claim 1, wherein the exposure mask is formed by means of a laser printer.

* * * * *

UNITED STATES PATENT AND TRADEMARK OFFICE
CERTIFICATE OF CORRECTION

PATENT NO. :     5,705,313
DATED      :     January 6, 1998
INVENTOR(S):     Werner FRASS et al.

It is certified that error appears in the above-identified patent and that said Letters Patent is hereby corrected as shown below:

Column 7, line 20, delete "9.0", and insert --19.0--.

Signed and Sealed this

Twenty-third Day of June, 1998

Attest:

BRUCE LEHMAN

*Attesting Officer*     *Commissioner of Patents and Trademarks*